(12) United States Patent
Kojima et al.

(10) Patent No.: US 10,825,756 B2
(45) Date of Patent: Nov. 3, 2020

(54) CHIP ATTACHED TO A DIE PAD HAVING A CONCAVE STRUCTURE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Hideharu Kojima, Kanazawa (JP); Yoshiharu Takada, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

(*) Notice: Subject to any disclaimer, the term of this patent is extended or adjusted under 35 U.S.C. 154(b) by 0 days.

(21) Appl. No.: 16/291,450

(22) Filed: Mar. 4, 2019

(65) Prior Publication Data

US 2020/0075464 A1 Mar. 5, 2020

(30) Foreign Application Priority Data

Sep. 5, 2018 (JP) .................. 2018-166139

(51) Int. Cl.
*H01L 23/495* (2006.01)
*H01L 23/48* (2006.01)
(Continued)

(52) U.S. Cl.
CPC .... *H01L 23/49548* (2013.01); *H01L 21/4821* (2013.01); *H01L 23/49503* (2013.01); *H01L 23/49513* (2013.01); *H01L 24/32* (2013.01);
*H01L 2224/16012* (2013.01); *H01L 2224/16104* (2013.01); *H01L 2224/29026* (2013.01);
(Continued)

(58) Field of Classification Search
CPC .......... H01L 21/4821; H01L 23/49545; H01L 23/49503; H01L 23/49548; H01L 24/32; H01L 23/49513; H01L 2224/16012; H01L 2224/16104; H01L 2224/32012; H01L 2224/32104; H01L 2224/29026
See application file for complete search history.

(56) References Cited

U.S. PATENT DOCUMENTS

| 7,838,974 B2 * | 11/2010 | Poddar ............. H01L 23/49503 257/676 |
| 2007/0075404 A1 * | 4/2007 | Dimaano, Jr. .... H01L 23/49503 257/666 |

(Continued)

FOREIGN PATENT DOCUMENTS

| JP | 2008-294172 | 12/2008 | |
| JP | 2012104709 A * | 5/2012 | ............. H01L 24/32 |

(Continued)

*Primary Examiner* — Alonzo Chambliss
(74) *Attorney, Agent, or Firm* — Oblon, McClelland, Maier & Neustadt, L.L.P.

(57) ABSTRACT

According to one embodiment, a semiconductor device includes a semiconductor chip, and a die pad. The die pad has a first surface. The semiconductor chip is bonded on the first surface using a paste including a metal particle. A concave structure is provided in the first surface. The concave structure is positioned directly under each of a plurality of sides of the semiconductor chip and extends along each of the plurality of sides.

8 Claims, 11 Drawing Sheets

(51) Int. Cl.
     *H01L 21/00*      (2006.01)
     *H05K 7/12*       (2006.01)
     *H01L 21/48*      (2006.01)
     *H01L 23/00*      (2006.01)

(52) U.S. Cl.
     CPC ............... *H01L 2224/32012* (2013.01); *H01L 2224/32104* (2013.01)

(56) References Cited

U.S. PATENT DOCUMENTS

2013/0093072 A1* 4/2013 Zhang ............... H01L 23/49503
                                                                                257/676
2017/0309547 A1* 10/2017 Shimizu ................ H01L 21/563
2019/0267310 A1* 8/2019 Rodriguez ........ H01L 23/49513

FOREIGN PATENT DOCUMENTS

| JP | 2012-119485 | 6/2012 |
|----|-------------|--------|
| JP | 5131148 | 1/2013 |
| JP | 5533619 | 6/2014 |

\* cited by examiner

CHIP ATTACHED TO A DIE PAD HAVING A CONCAVE STRUCTURE

CROSS-REFERENCE TO RELATED APPLICATIONS

This application is based upon and claims the benefit of priority from Japanese Patent Application No. 2018-166139, filed on Sep. 5, 2018; the entire contents of which are incorporated herein by reference.

FIELD

Embodiments described herein relate generally to a semiconductor device and a method for manufacturing the same.

BACKGROUND

There is a method for bonding a semiconductor chip on a die pad by using a paste including metal particles. For this method, technology that can suppress the occurrence of bonding defects is desirable.

DETAILED DESCRIPTION

Figure 1:
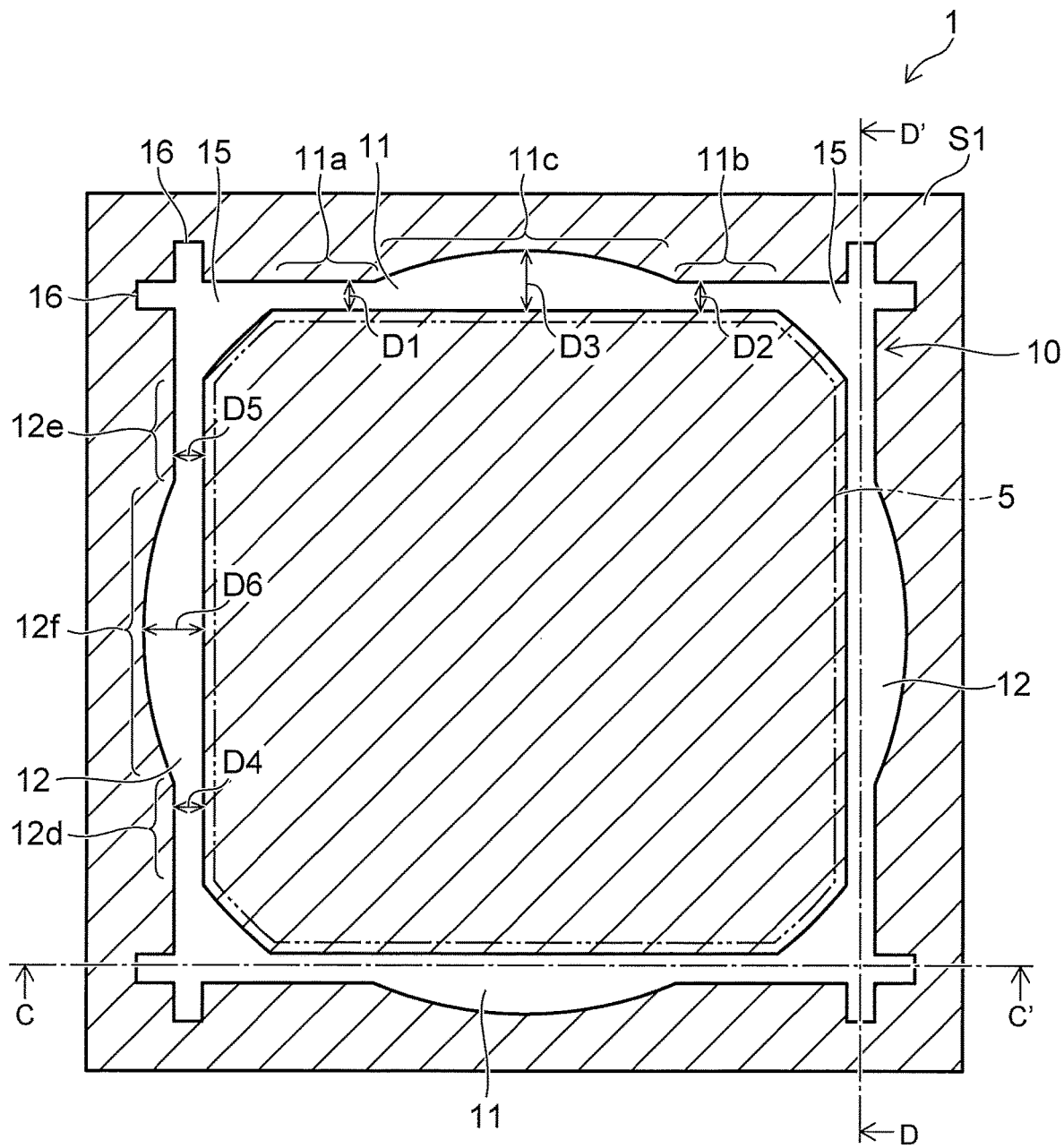
FIG. 1 is a plan view illustrating a die pad of a semiconductor device according to an embodiment.
Figure 1:
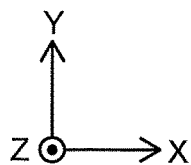

According to one embodiment, a semiconductor device includes a semiconductor chip and a die pad. The die pad has a first surface. The semiconductor chip is bonded on the first surface using a paste including a metal particle. A concave structure is provided in the first surface. The concave structure is positioned directly under each of a plurality of sides of the semiconductor chip and extends along each of the plurality of sides.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a plan view illustrating a die pad of a semiconductor device according to an embodiment.

As illustrated in FIG. 1, the die pad 1 of the semiconductor device according to the embodiment has a first surface S1. A semiconductor chip is bonded to the first surface S1.

An XYZ orthogonal coordinate system is used in the description of the embodiment. Two mutually-orthogonal directions parallel to the first surface are taken as an X-direction (a first direction) and a Y-direction (a second direction). A direction perpendicular to the X-direction and the Y-direction is taken as a Z-direction.

The die pad 1 is, for example, a metal member having a plate configuration having sides parallel to the X-direction and sides parallel to the Y-direction. A concave structure 10 is provided in the first surface S1. The concave structure 10 includes a pair of first recesses 11 extending in the X-direction and a pair of second recesses 12 extending in the Y-direction. The pair of first recesses 11 is separated from each other in the Y-direction. The pair of second recesses 12 is separated from each other in the X-direction. A bonding region 5 where the semiconductor chip is placed and bonded is provided inside the region surrounded with the pair of first recesses 11 and the pair of second recesses 12.

Figure 2:
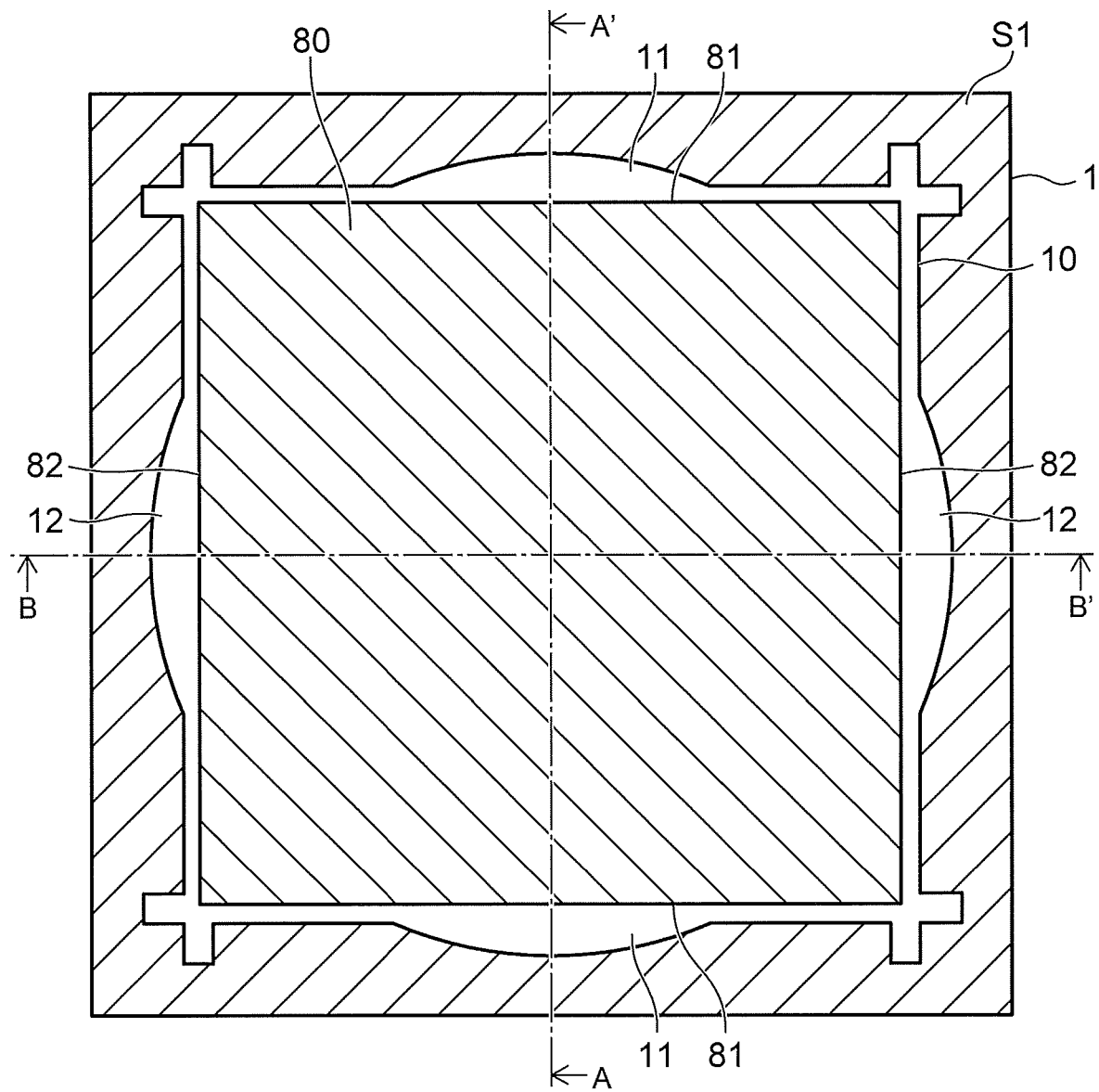
FIG. 2 is a plan view illustrating a state in which the semiconductor chip is bonded to the die pad according to the embodiment.

FIG. 2 is a plan view illustrating a state in which the semiconductor chip is bonded to the die pad according to the embodiment.

Figure 3A:
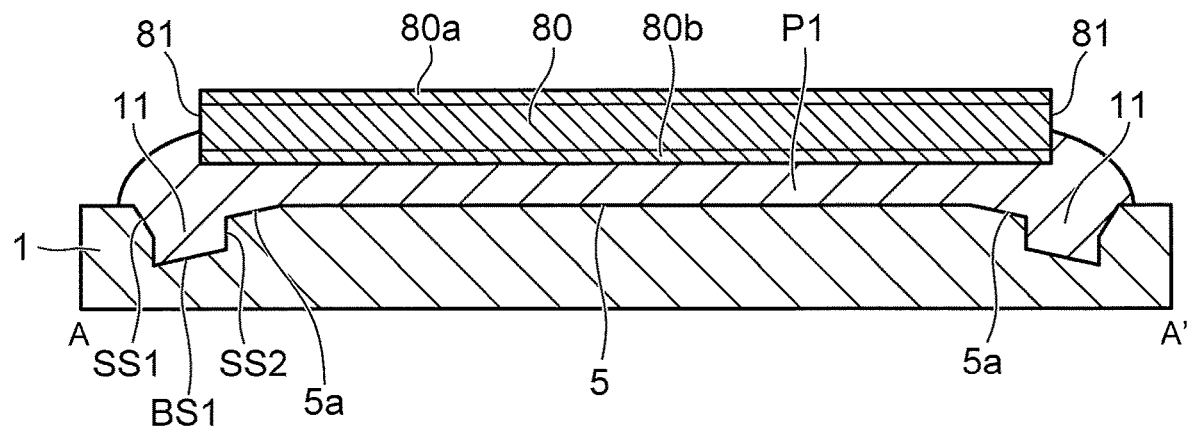
FIG. 3A is an A-A' cross-sectional view of FIG. 2.
Figure 3B:
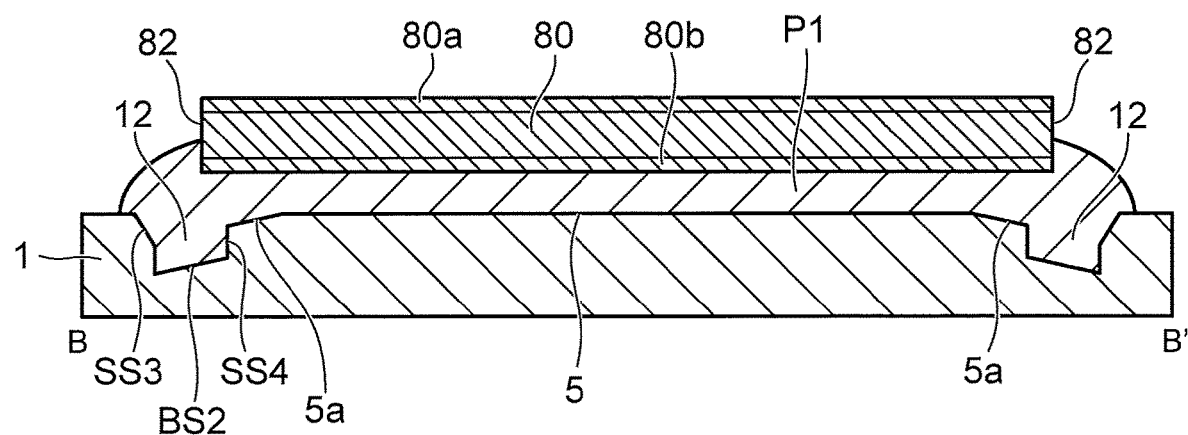
FIG. 3B is a B-B' cross-sectional view of FIG. 2.

FIG. 3A is an A-A' cross-sectional view of FIG. 2. FIG. 3B is a B-B' cross-sectional view of FIG. 2.

As illustrated in FIG. 2, a semiconductor chip 80 is bonded to the first surface S1. The exterior form of the semiconductor chip 80 is, for example, a quadrilateral. The semiconductor chip 80 includes a pair of sides 81 (first sides) parallel to the X-direction and a pair of sides 82 (second sides) parallel to the Y-direction. As illustrated in FIG. 3A and FIG. 3B, the semiconductor chip 80 includes an upper electrode 80a and a lower electrode 80b.

As illustrated in FIG. 2 and FIG. 3A, the pair of first recesses 11 is respectively positioned directly under the pair of sides 81 and is provided along the pair of sides 81. As illustrated in FIG. 2 and FIG. 3B, the pair of second recesses 12 is respectively positioned directly under the pair of sides 82 and is provided along the pair of sides 81.

Figure 4A:
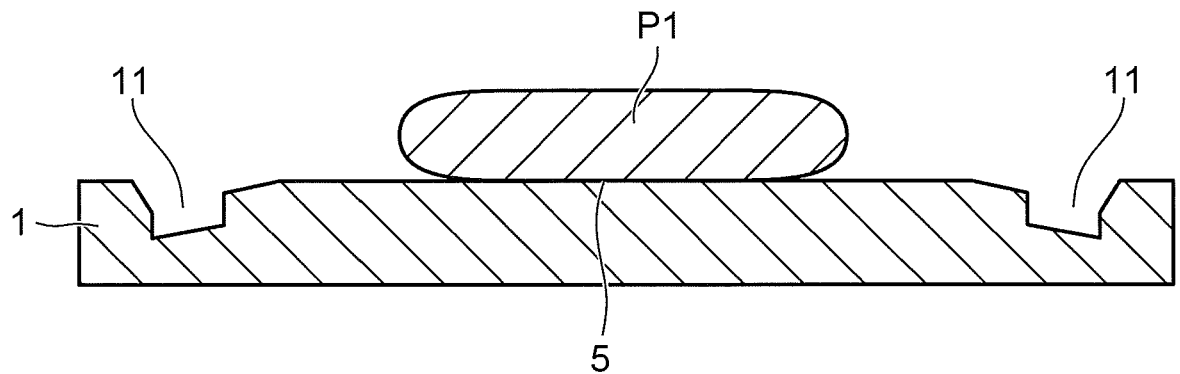
FIG. 4A to FIG. 4C are process cross-sectional views illustrating a method for manufacturing the semiconductor device according to the embodiment.
Figure 4B:
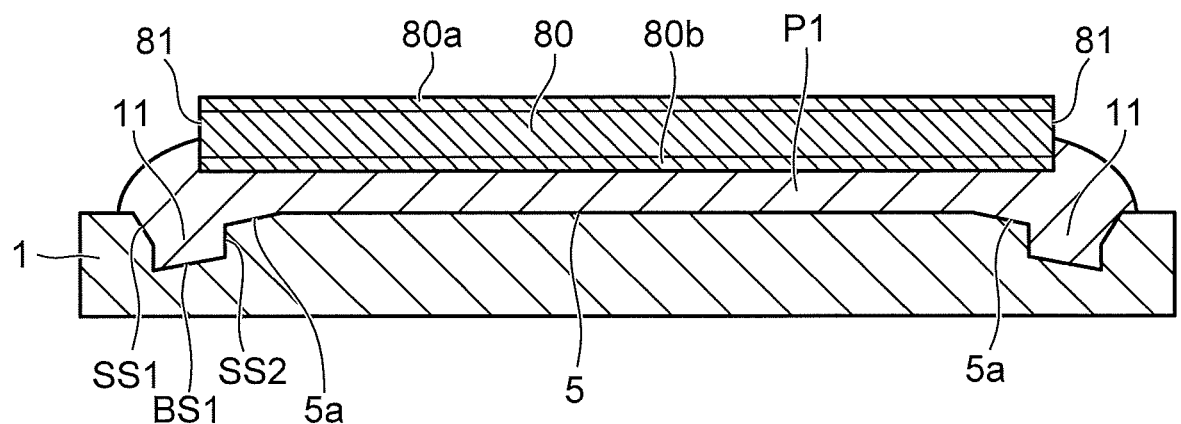
Figure 4C:
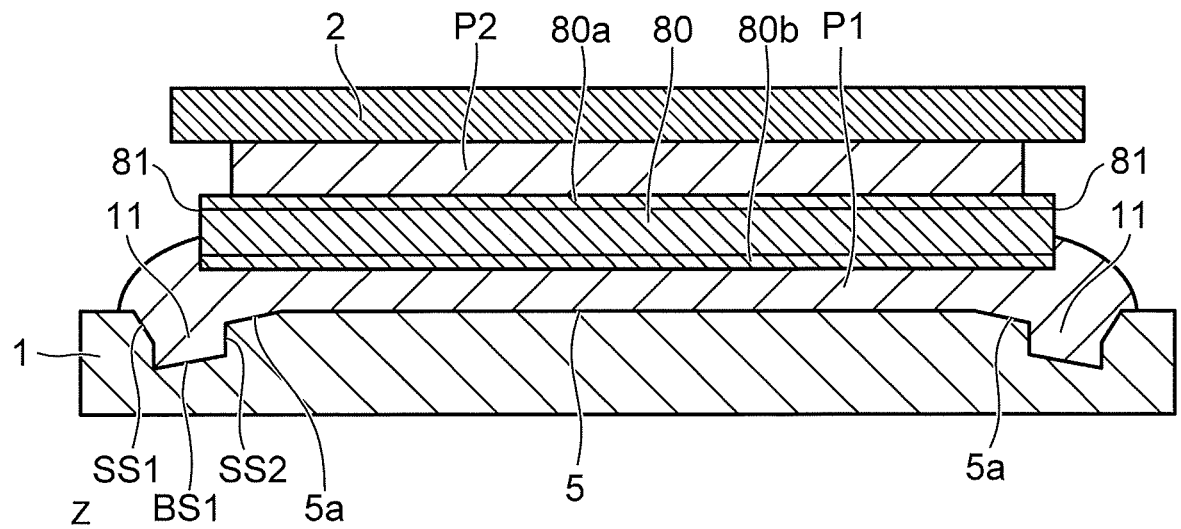

FIG. 4A to FIG. 4C are process cross-sectional views illustrating a method for manufacturing the semiconductor device according to the embodiment.

FIG. 4A to FIG. 4C illustrate states of a Y-Z cross section corresponding to the A-A' cross section of FIG. 2. The states of the X-Z cross section are substantially the same as FIG. 4A to FIG. 4C.

First, as illustrated in FIG. 4A, a paste P1 that includes metal particles is disposed on the bonding region 5 of the first surface S1. The paste P1 includes, for example, a resin and the metal particles dispersed in the resin. The metal particles are, for example, nano-sized and are formed by evaporating a metal material in an inert atmosphere. Or, the metal particles may be fine metal sintered bodies. Silver, copper, gold, or the like is used as the material of the metal particles. The resin is, for example, an epoxy resin, a polyimide resin, etc.

By using the paste P1 for the bond, for example, compared to the case where solder is used for the bond, the electrical resistance can be reduced or the thermal conductivity can be improved between the die pad 1 and the semiconductor chip 80.

As illustrated in FIG. 4B, the semiconductor chip 80 is bonded on the bonding region 5 where the paste P1 is disposed. At this time, the semiconductor chip 80 is provided on the bonding region 5 so that the pair of first recesses 11 is respectively positioned directly under the pair of sides 81, and the pair of second recesses 12 is respectively positioned directly under the pair of sides 82.

In the bonding, the paste P1 is heated to about 200° C. to 250° C. When bonding, the semiconductor chip 80 may be pressed toward the first surface S1. By the heating, the resin inside the paste P1 cures and the metal particles inside the paste P1 are bonded to each other. The die pad 1 and the lower electrode 80b of the semiconductor chip 80 are electrically connected.

As illustrated in FIG. 4C, a paste P2 is disposed on the upper electrode 80a of the semiconductor chip 80; and a metal member 2 is bonded on the semiconductor chip 80 via the paste P2. The metal member 2 is a metal terminal such as a lead, a connector, etc. The material of the paste P2 is, for example, the same as the material of the paste P1. Similarly to the description recited above, in the bonding, the metal member 2 is heated while being pressed toward the semiconductor chip 80. Thereby, the upper electrode 80a of the semiconductor chip 80 and the metal member 2 are electrically connected by the metal particles inside the paste P2.

Effects of the embodiment will now be described with reference to FIG. 5A and FIG. 5B.

Figure 5A:
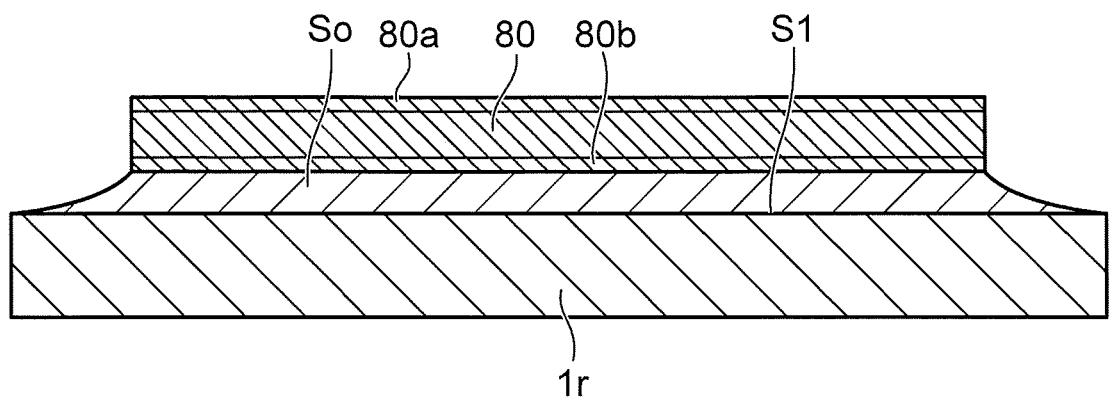
FIG. 5A and FIG. 5B are cross-sectional views illustrating a method for manufacturing a semiconductor device using a die pad according to a reference example.
Figure 5B:
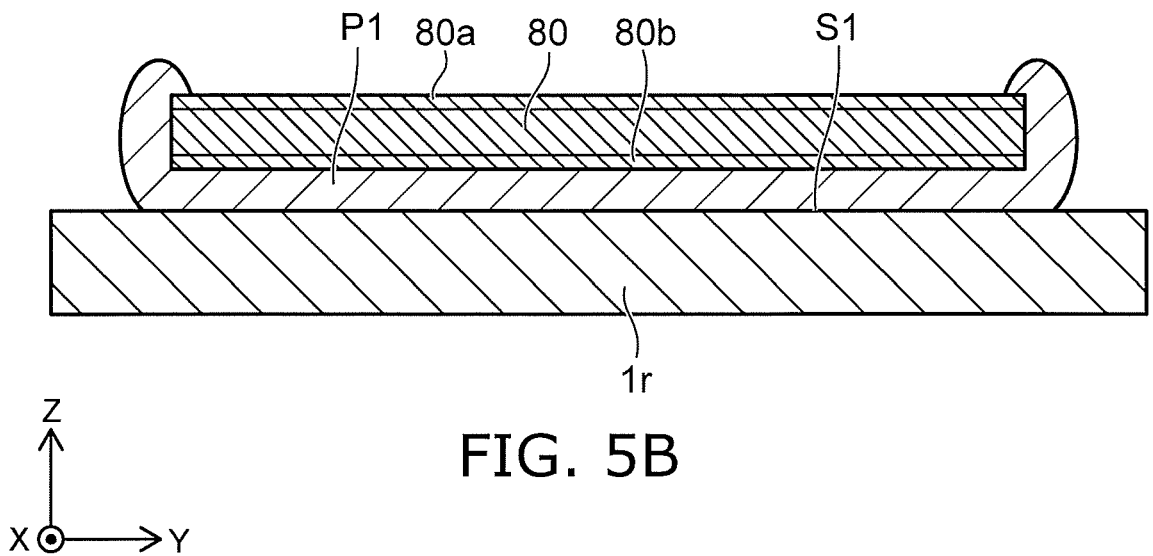

FIG. 5A and FIG. 5B are cross-sectional views illustrating a method for manufacturing a semiconductor device using a die pad according to a reference example.

The concave structure 10 is not provided in the upper surface of a die pad 1r according to the reference example. FIG. 5A illustrates a state in the case where solder So is used for the bond between the semiconductor chip 80 and the die pad 1r according to the reference example. FIG. 5B illustrates a state in the case where the paste P1 is used for the bond between the die pad 1r and the semiconductor chip 80.

As illustrated in FIG. 5A, in the case where the solder So is used for the bond, when the semiconductor chip 80 is pressed toward the first surface S1, the solder So spreads along the first surface S1. If the solder So spreads excessively along the first surface S1, the solder So overflows from the die pad 1r; and there is a possibility that the semiconductor device cannot be manufactured appropriately. There is also a possibility that the solder So may spread excessively only in one designated direction; and the bond between the first surface S1 and the semiconductor chip 80 may be partially defective.

For this problem, there are methods in which multiple recesses are arranged regularly in the first surface S1, or a protrusion having a ring configuration is provided in the first surface S1. According to these methods, the spreading of the solder So can be adjusted; and the occurrence of the bonding defects can be suppressed.

On the other hand, in the case where the paste including the metal particles is used for the bond, problems occur that are different from those in the case where the solder is used. In the case where the paste P1 is used, as illustrated in FIG. 5B, when the semiconductor chip 80 is pressed toward the first surface S1, the paste P1 travels over the side surface of the semiconductor chip 80 and flows around to the upper surface side of the semiconductor chip 80. At this time, if the paste P1 contacts the upper electrode 80a of the semiconductor chip 80, etc., the upper electrode 80a and the lower electrode 80b are electrically connected via the paste P1. Thereby, operation errors of the semiconductor device occur. The flow-around to the upper surface side is unique to the paste P1. The problem of such flow-around cannot be solved by the structure of the first surface S1 for adjusting the spreading of the solder described above.

In the die pad 1 of the semiconductor device according to the embodiment, the concave structure 10 of the first surface S1 is positioned directly under each of the multiple sides of the semiconductor chip 80 and extends along each of the sides. In other words, the first recesses 11 and the second recesses 12 are provided respectively directly under the sides 81 and the sides 82 of the semiconductor chip 80. According to this structure, the paste P1 that flows out from under the semiconductor chip 80 when pressing moves easily toward the concave structure 10 rather than toward the side surface of the semiconductor chip 80. The paste P1 flowing around to the upper surface side of the semiconductor chip 80 can be suppressed; and the occurrence of the bonding defects can be suppressed. In other words, by manufacturing the semiconductor device using the die pad 1, the occurrence of the bonding defects can be suppressed; and the reliability of the semiconductor device can be increased. The manufacturing yield of the semiconductor device can be improved; and the manufacturing cost of the semiconductor device can be reduced.

A desirable structure of the die pad 1 will now be described more specifically.

The dimension in the Y-direction of the first recess 11 of the concave structure 10 changes along the X-direction. As illustrated in FIG. 1, the first recess 11 includes, for example, a first region 11a, a second region 11b, and a third region 11c. The first region 11a and the second region 11b are separated in the X-direction. The third region 11c is positioned between the first region 11a and the second region 11b. The third region 11c is positioned directly under the center in the X-direction of the side 81.

A dimension D3 in the Y-direction of the third region 11c is longer than a dimension D1 in the Y-direction of the first region 11a and longer than a dimension D2 in the Y-direction of the second region 11b. By setting the dimension D3 to be long, the paste P1 flowing around to the upper surface of the semiconductor chip 80 can be suppressed further.

This is due to the following reasons. Generally, the paste P1 is disposed at the center of the bonding region 5. The distance between the paste P1 and the center in the X-direction of the side 81 is shorter than the distance between the paste P1 and the corner of the semiconductor chip 80. More of the paste P1 moves to the vicinity of the center in the X-direction of the side 81. The paste P1 flowing around to the upper surface of the semiconductor chip 80 occurs easily at the vicinity of the center in the X-direction of the side 81. By setting the dimension D3 in the Y-direction of the third region 11c to be long, more of the paste P1 can flow to the third region 11c. The paste P1 flowing around to the upper surface of the semiconductor chip 80 from the vicinity of the center in the X-direction of the side 81 can be suppressed.

There is a tendency for the paste P1 to become insufficient easily between the corner of the semiconductor chip 80 and the die pad 1. As described above, this is because the distance between the position where the paste P1 is disposed and the corner is long. When the paste P1 flows to the first to third regions 11a to 11c and these regions are filled with the paste P1, a portion of the excess paste P1 travels through the concave structure 10 and moves to the four corners of the concave structure 10. By setting the dimension D1 and the dimension D2 to be shorter than the dimension D3, the amount of the paste P1 collecting in these regions can be limited while suppressing the flow-around of the paste P1 directly above the first region 11a and the second region 11b. More of the paste P1 flows easily toward the four corners of the concave structure 10; and more of the paste P1 is supplied between the corners of the semiconductor chip 80 and the die pad 1. As a result, the occurrence of the bonding defects at the corners of the semiconductor chip 80 can be suppressed.

Similarly to the first recess 11, the dimension in the X-direction of the second recess 12 changes along the Y-direction. The second recess 12 includes a fourth region 12d, a fifth region 12e, and a sixth region 12f. The sixth region 12f is positioned between the fourth region 12d and the fifth region 12e in the Y-direction. The sixth region 12f is positioned directly under the center in the Y-direction of the side 82. A dimension D6 in the X-direction of the sixth region 12f is longer than a dimension D4 in the X-direction of the fourth region 12d and longer than a dimension D5 in the X-direction of the fifth region 12e. By this structure, the flow-around of the paste P1 from the side 82 can be suppressed; and the occurrence of the bonding defects at the corners of the semiconductor chip 80 can be suppressed.

As illustrated in FIG. 1, corner portions 15 may be provided at the four corners of the concave structure 10. The corner portions 15 are positioned directly under the corners of the semiconductor chip 80. Compared to the first recess 11 and the second recess 12, the width of the corner portion 15 is wide. In other words, the dimension in the Y-direction of the corner portion 15 is longer than the dimension D1 and the dimension D2. The dimension in the X-direction of the corner portion 15 is longer than the dimension in the X-direction of the second recess 12 (e.g., the sixth region 12f).

As described above, because the paste P1 moves easily to the four corners of the concave structure 10, the occurrence of the bonding defects at the corners of the semiconductor chip 80 can be suppressed. On the other hand, as a result of the paste P1 moving easily to the four corners, there is also a possibility that much of the paste P1 may flow partially to one of the four corners of the concave structure 10 due to fluctuation of the amount and/or the position where the paste P1 is disposed, etc. In such a case, if the paste P1 flows out from the concave structure 10, there is a possibility that the paste P1 may flow around to the upper surface of the semiconductor chip 80. By providing the corner portions 15 where more of the paste P1 can collect, the outflow of the paste P1 at the corners of the concave structure 10 can be suppressed.

The first recess 11 is connected to the second recess 12 at the corner portion 15. The concave structure 10 includes a protruding portion 16 protruding from the corner portion 15 toward the outer perimeter sides of the die pad 1. The configuration of the protruding portion 16 is arbitrary. In the example illustrated in FIG. 1, two protruding portions 16 that protrude respectively along the X-direction and the Y-direction from each corner portion 15 are provided. By providing the protruding portion 16, similarly to the case where the corner portion 15 is provided, the paste P1 collects easily inside the concave structure 10 when excess paste P1 occurs at the four corners of the concave structure 10.

As illustrated in FIG. 3A and FIG. 3B, it is desirable for a tilted surface 5a that communicates with the concave structure 10 to be provided at the outer perimeter of the bonding region 5. The tilted surface 5a is tilted toward a second surface of the die pad 1 opposing the first surface S1.

By providing the tilted surface 5a, the paste P1 that spreads toward the outer perimeter of the semiconductor chip 80 moves easily to the lower side where the concave structure 10 is provided rather than to the upper surface side of the semiconductor chip 80. The paste P1 flowing around to the upper surface of the semiconductor chip 80 can be suppressed further.

Figure 6A:
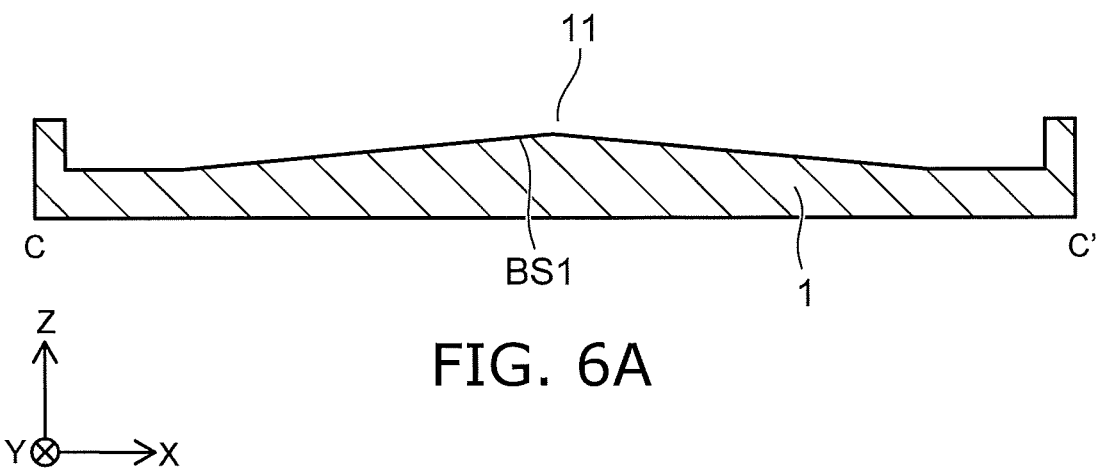
FIG. 6A is a C-C' cross-sectional view of FIG. 1.
Figure 6B:
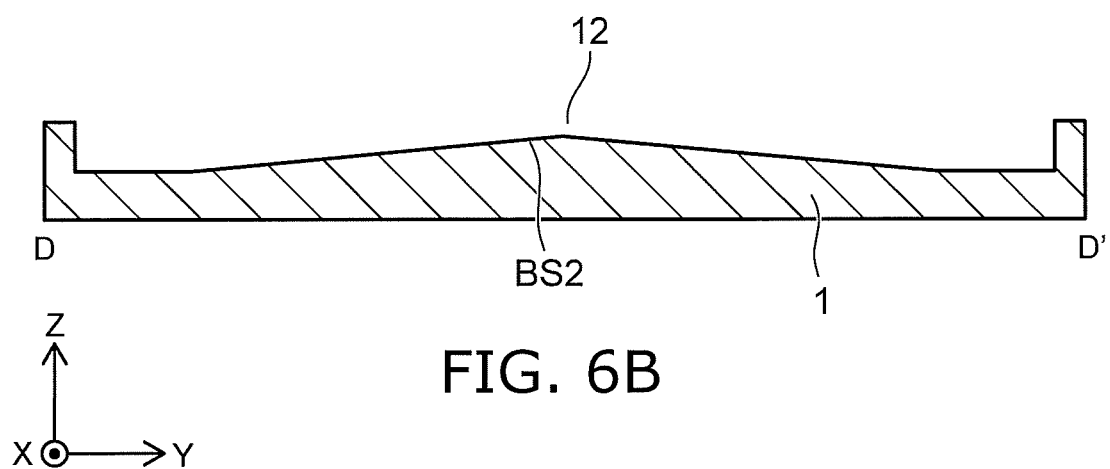
FIG. 6B is a D-D' cross-sectional view of FIG. 1.

FIG. 6A is a C-C' cross-sectional view of FIG. 1. FIG. 6B is a D-D' cross-sectional view of FIG. 1.

As illustrated in FIG. 6A, it is desirable for a bottom surface BS1 of the first recess 11 to be tilted downward from the center in the X-direction of the first recess 11 toward the end in the X-direction of the first recess 11. In the example of FIG. 6A, the bottom surface BS1 includes two tilted surfaces. The two tilted surfaces are positioned between the center in the X-direction of the bottom surface BS1 and both ends in the X-direction of the bottom surface BS1, respectively. One of the tilted surfaces is tilted downward from the center toward one of the ends. Another one of the tilted surfaces is tilted downward from the center toward another one of the ends. As illustrated in FIG. 6B, it is desirable for a bottom surface BS2 of the second recess 12 to be tilted downward from the center in the Y-direction of the second recess 12 toward the end in the Y-direction of the second recess 12. By providing such tilts, the paste P1 that flows to the center in the X-direction of the first recess 11 and the center in the Y-direction of the second recess 12 moves easily to the four corners of the concave structure 10.

As illustrated in FIG. 3A and FIG. 3B, the bottom surface BS1 and the bottom surface BS2 may be tilted downward toward the outer perimeter side of the die pad 1. A side surface SS1 on the outer side of the first recess 11 and a side surface SS3 on the outer side of the second recess 12 may be tilted with respect to the Z-direction. In the example of FIG. 3A and FIG. 3B, a side surface SS2 on the inner side of the first recess 11 and a side surface SS4 on the inner side of the second recess 12 are parallel to the Z-direction but may be tilted with respect to the Z-direction. The amount of the paste P1 that can collect in the first recess 11 and the second recess 12 can be adjusted by adjusting the tilts of these side surfaces and bottom surfaces.

First Modification

Figure 7:
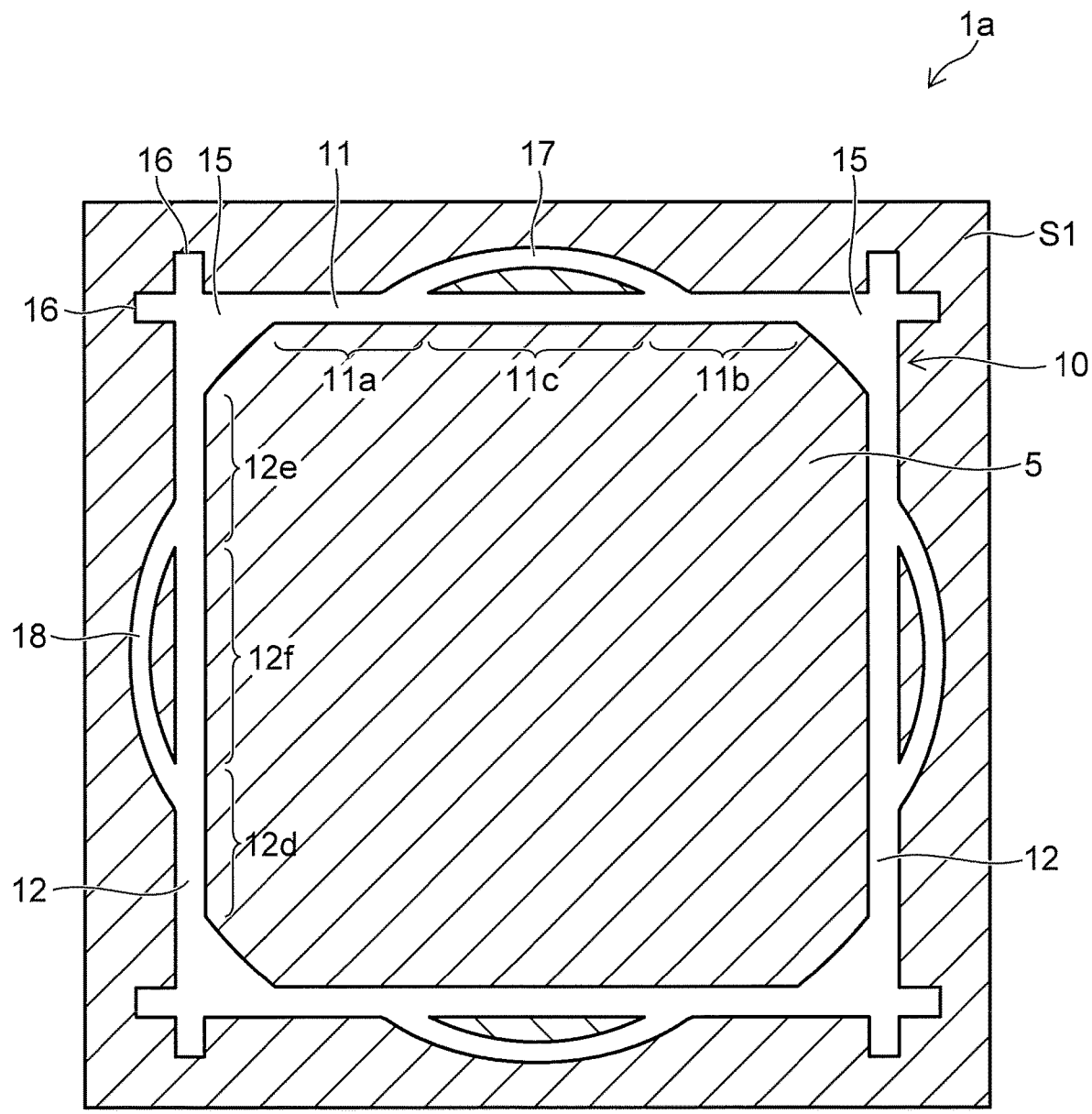
FIG. 7 is a plan view illustrating a die pad according to a first modification of the embodiment.

FIG. 7 is a plan view illustrating a die pad according to a first modification of the embodiment.

In the die pad 1a according to the first modification, the configuration of the concave structure 10 is different from that of the die pad 1.

As illustrated in FIG. 7, the concave structure 10 of the die pad 1a includes an outer recess 17. The outer recess 17 is provided further on the outer perimeter side of the die pad 1a than is the first recess 11. In other words, the first recess 11 is positioned between the outer recess 17 and the bonding region 5 in the Y-direction. The outer recess 17 is curved; and the two ends in the X-direction of the outer recess 17 are connected to the first recess 11.

More specifically, in the die pad 1a, the dimensions in the Y-direction of the first region 11a, the second region 11b, and the third region 11c of the first recess 11 are the same. The outer recess 17 is separated from the third region 11c in the Y-direction. Also, the two ends in the X-direction of the outer recess 17 are connected respectively to the first region 11a and the second region 11b.

In other words, in the die pad 1a, the outer recess 17 is provided instead of widening the dimension in the Y-direction of the third region 11c. According to this configuration, the paste P1 flowing around to the upper surface of the semiconductor chip 80 from the side 81 can be suppressed similarly to the case where the dimension in the Y-direction of the third region 11c is widened.

The concave structure 10 includes an outer recess 18 similar to the outer recess 17. The outer recess 18 is provided further on the outer perimeter side of the die pad 1a than is the second recess 12. The outer recess 18 is separated from the sixth region 12f in the X-direction, and is curved. The two ends in the Y-direction of the outer recess 18 are connected respectively to the fourth region 12d and the fifth region 12e. According to this configuration, the paste P1 flowing around to the upper surface of the semiconductor chip 80 from the side 82 can be suppressed similarly to the case where the dimension in the X-direction of the sixth region 12f is widened.

Here, an example is described in which the outer recesses 17 and 18 are curved. The specific configurations of the outer recesses 17 and 18 are modifiable as appropriate. For example, the outer recess 17 may include a portion extending in the X-direction parallel to the third region 11c, and portions extending in the Y-direction and being connected to the first region 11a and the second region 11b. This is similar for the outer recess 18 as well.

Second Modification

Figure 8:
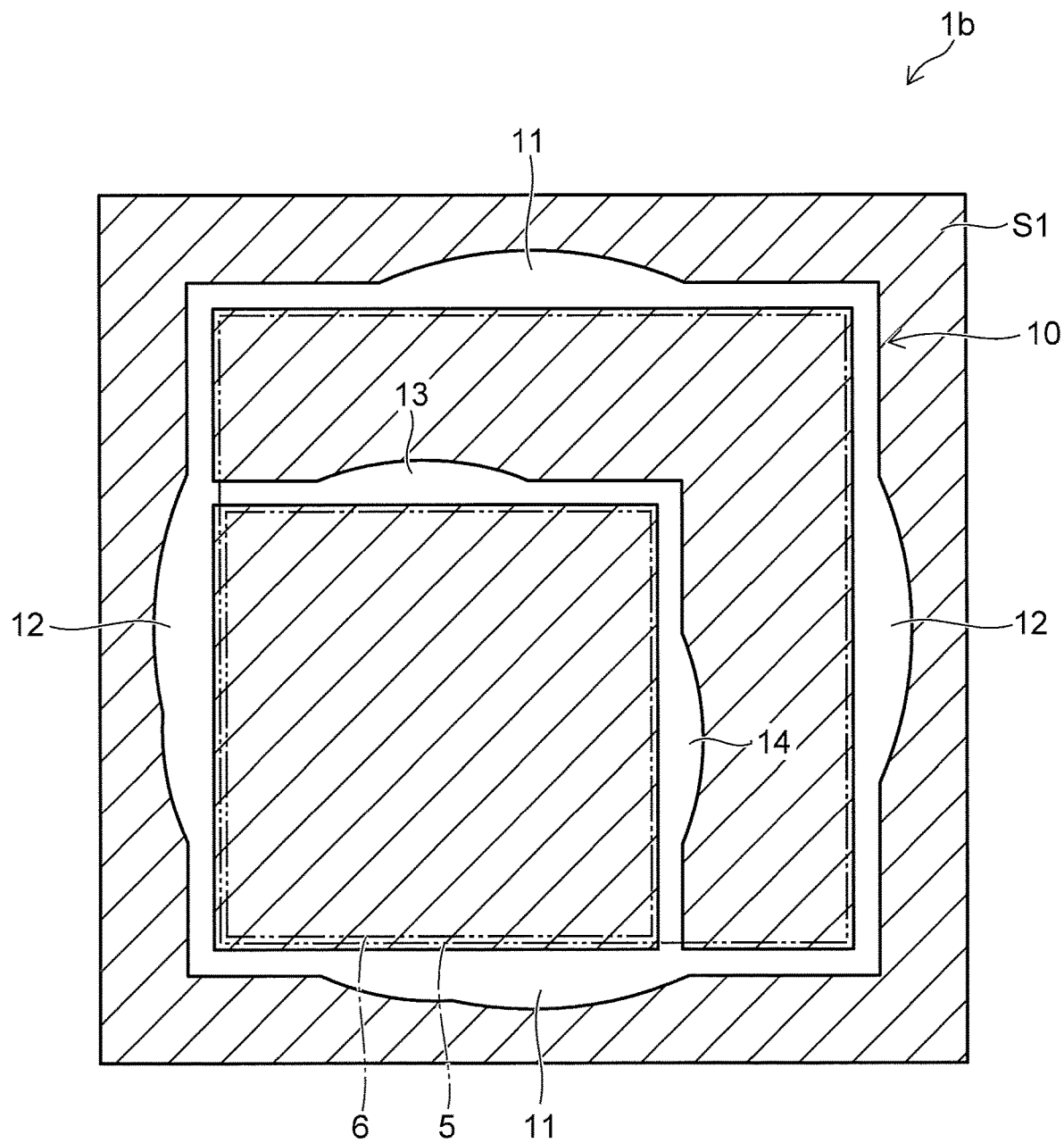
FIG. 8 is a plan view illustrating a die pad according to a second modification of the embodiment.

FIG. 8 is a plan view illustrating a die pad according to a second modification of the embodiment.

In the die pad 1b according to the second modification, the concave structure 10 is provided to correspond to multiple semiconductor chips having mutually-different sizes. As illustrated in FIG. 8, the die pad 1b includes the bonding region 5 where one semiconductor chip is bondable, and a bonding region 6 where another semiconductor chip smaller than the one semiconductor chip is bondable.

Specifically, the concave structure 10 includes the first recesses 11 and a third recess 13 extending in the X-direction, and the second recesses 12 and a fourth recess 14 extending in the Y-direction. The dimension in the X-direction of the first recess 11 is longer than the dimension in the X-direction of the third recess 13. The third recess 13 is positioned between the pair of first recesses 11 in the Y-direction. The dimension in the Y-direction of the second recess 12 is longer than the dimension in the Y-direction of the fourth recess 14. The fourth recess 14 is positioned between the pair of second recesses 12 in the X-direction.

The bonding region 6 is a region surrounded with the first recess 11, the second recess 12, the third recess 13, and the fourth recess 14. The bonding region 5 is wider than the bonding region 6 and is a region surrounded with the pair of first recesses 11 and the pair of second recesses 12.

Figure 9:
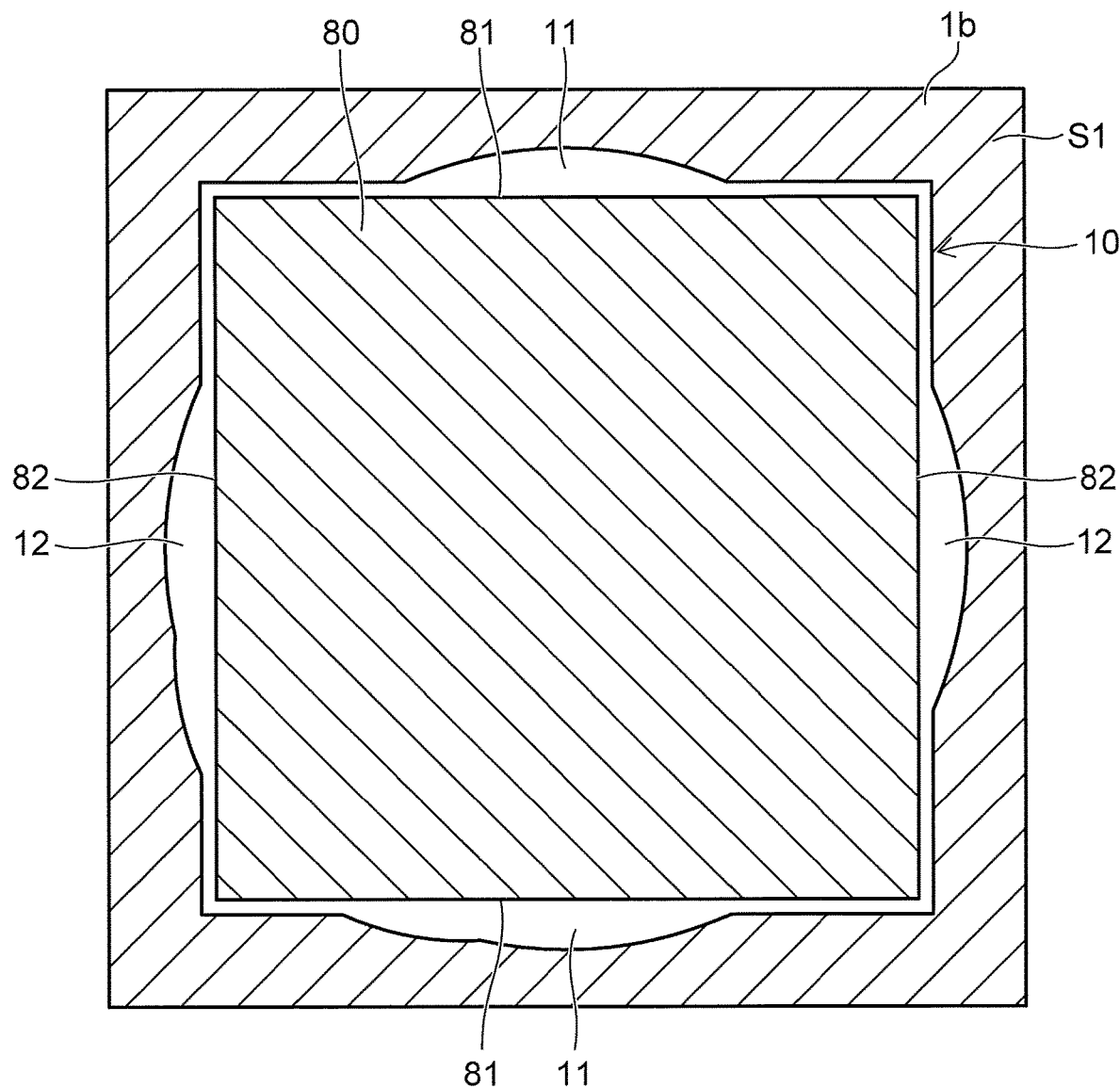
FIG. 9 is a plan view illustrating states in which semiconductor chips are bonded to the die pad according to the second modification of the embodiment.
Figure 10:
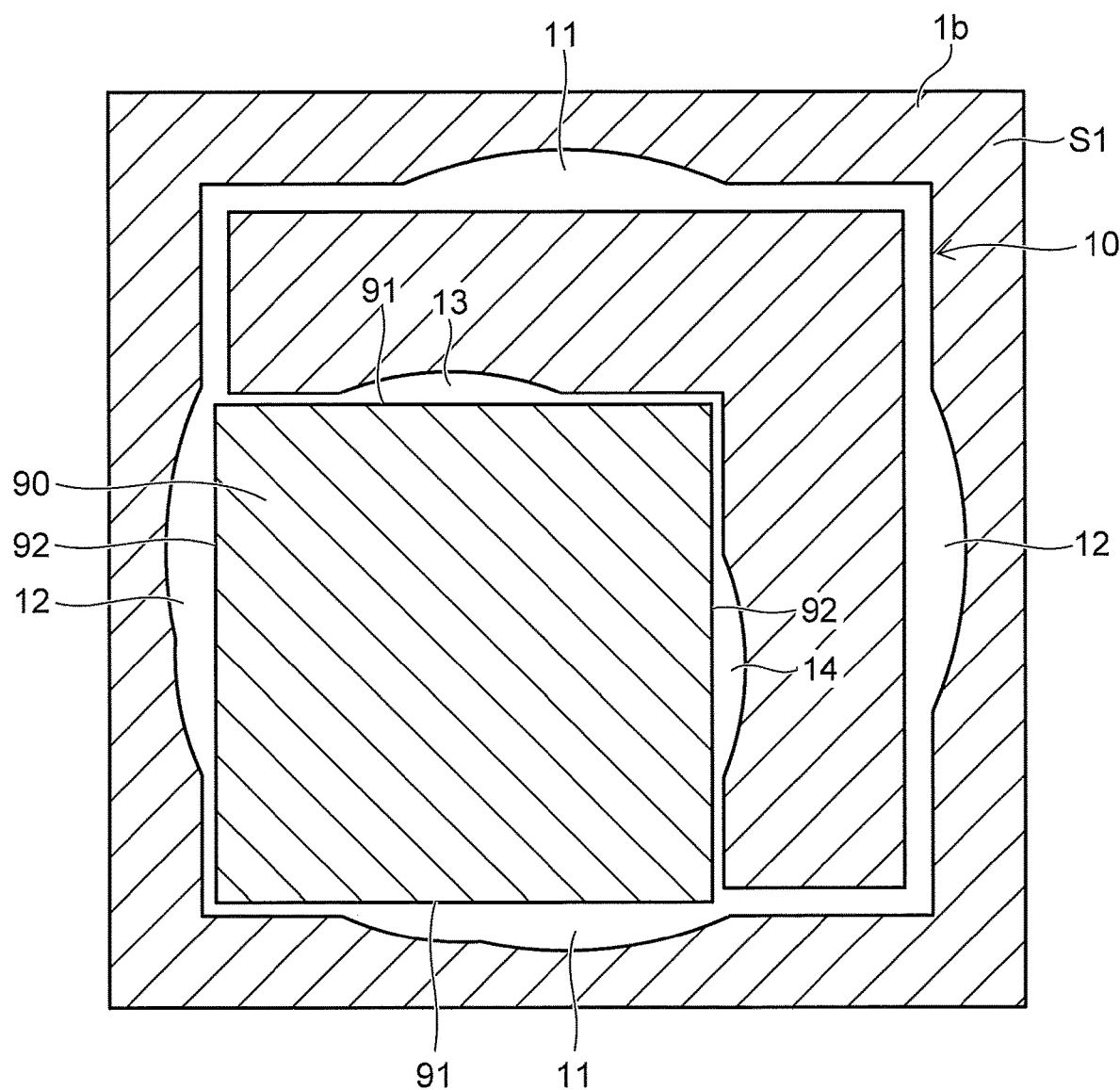
FIG. 10 is a plan view illustrating states in which semiconductor chips are bonded to the die pad according to the second modification of the embodiment.

FIG. 9 and FIG. 10 are plan views illustrating states in which semiconductor chips are bonded to the die pad according to the second modification of the embodiment.

FIG. 9 illustrates a state in which the semiconductor chip 80 is bonded to the bonding region 5. FIG. 10 illustrates a state in which a semiconductor chip 90 that is smaller than the semiconductor chip 80 is bonded to the bonding region 6.

As illustrated in FIG. 9, the die pad 1b is similar to the die pad 1 in that the first recesses 11 and the second recesses 12 are respectively positioned directly under the sides 81 and the sides 82 of the semiconductor chip 80. Also, as illustrated in FIG. 10, in the case where the semiconductor chip 90 is bonded to the die pad 1b, the third recess 13 and a portion of the first recess 11 are positioned along sides 91 and directly under the sides 91 of the semiconductor chip 90. The fourth recess 14 and a portion of the second recess 12 are positioned along sides 92 and directly under the sides 92 of the semiconductor chip 90.

When the semiconductor chip 80 is bonded to the die pad 1b, the excess paste P1 flows to the pair of first recesses 11 and the pair of second recesses 12; and the occurrence of the bonding defects can be suppressed. When the semiconductor chip 90 is bonded to the die pad 1b, the excess paste P1 flows to the portion of the first recess 11, the portion of the second recess 12, the third recess 13, and the fourth recess 14; and the occurrence of the bonding defects can be suppressed. In other words, when the semiconductor chip 90 is bonded, a portion of one first recess 11 functions as the third recess 13; and a portion of one second recess 12 functions as the fourth recess 14.

As described above, the portion of the die pad 1b where the semiconductor chip 80 is bonded and the portion of the die pad 1b where the semiconductor chip 90 is bonded each have substantially the same structure as the portion of the die pad 1 where the semiconductor chip 80 is bonded. Thereby, the flow-around of the paste for the semiconductor chip 80 or 90 can be suppressed. According to the modification, multiple semiconductor chips having mutually-different sizes can be bonded to one die pad 1b. Therefore, it is unnecessary to prepare a die pad for each semiconductor chip size. For example, the types of the members for manufacturing the semiconductor device can be reduced; and the management cost can be reduced.

Otherwise, the structure of the concave structure 10 of the die pad 1b is substantially the same as the structure of the concave structure 10 of the die pad 1. For example, the dimension in the Y-direction of the third recess 13 changes along the X-direction to be widest at the center in the X-direction of the third recess 13. The dimension in the X-direction of the fourth recess 14 changes along the Y-direction to be the widest at the center in the Y-direction of the fourth recess 14. Otherwise, the corner portion 15 and/or the protruding portion 16 may be provided in the concave structure 10 similarly to the example illustrated in FIG. 1.

In the die pad 1b, one first recess 11 and one second recess 12 function as recesses for suppressing the paste P1 flowing around to the upper surface side of the semiconductor chip when bonding either of the semiconductor chips 80 and 90. According to this structure, the semiconductor chips can be bonded using one of the four corners of the concave structure 10 as a reference when bonding each of the semiconductor chips on the first surface S1. Therefore, the manufacturing of the semiconductor device is easy.

Figure 11A:
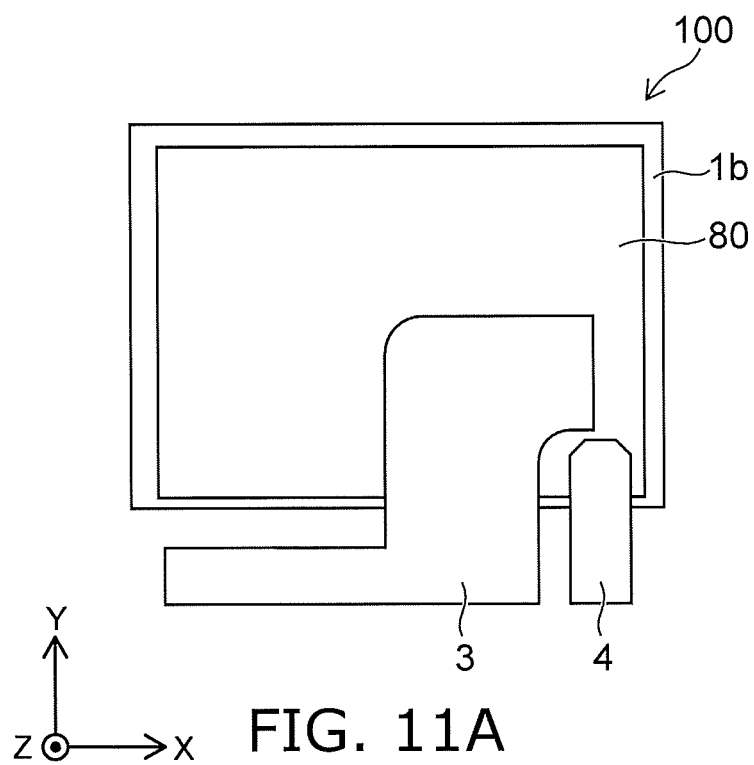
FIG. 11A and FIG. 11B are plan views illustrating semiconductor devices according to the embodiment.
Figure 11B:
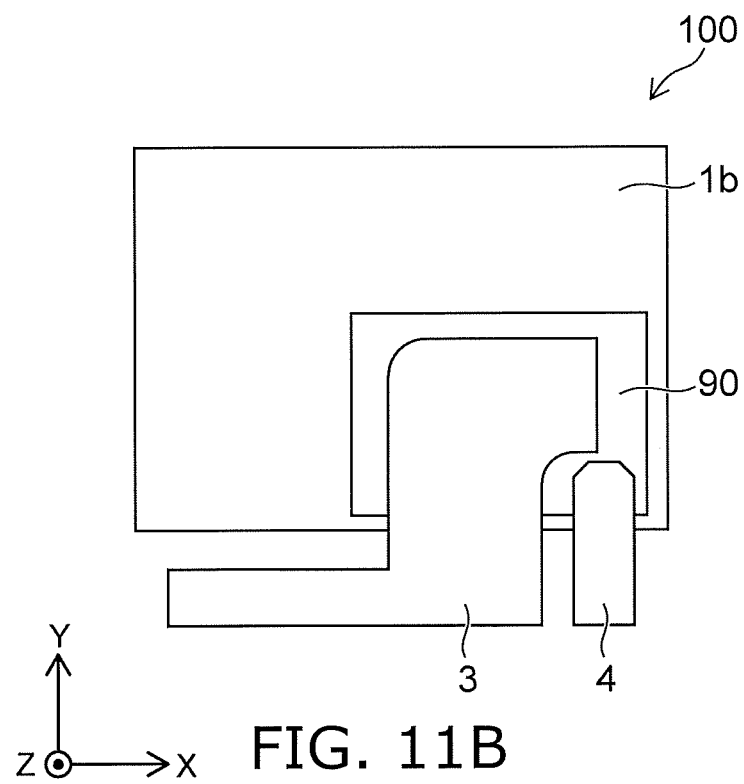

FIG. 11A and FIG. 11B are plan views illustrating semiconductor devices according to the embodiment.

The semiconductor devices according to the embodiment include one die pad according to the embodiment and semiconductor chips bonded to the die pad.

In the example illustrated in FIG. 11A, a semiconductor device 100 according to the embodiment includes the die pad 1b according to the second modification, the semiconductor chip 80, a connector 3, and a connector 4. In the example, not-illustrated multiple upper electrodes are provided on the upper surface of the semiconductor chip 80. The connectors 3 and 4 are bonded respectively to the multiple upper electrodes.

In the example illustrated in FIG. 11B, the semiconductor device 100 includes the die pad 1b, the semiconductor chip 90, the connector 3, and the connector 4. As illustrated in FIG. 11A and FIG. 11B, by using the die pad 1b according to the second modification, the semiconductor chip can be bonded on the die pad 1b regardless of the size of the semiconductor chip. By shifting the metal members (the connectors) connected on the semiconductor chip to one of the four corners of the first surface S1 of the die pad 1b, it is possible to bond the metal members to the semiconductor chip regardless of the size of the semiconductor chip.

According to the manufacturing method according to the embodiment described above, the paste flowing around to the upper surface side of the semiconductor chip when bonding the semiconductor chip to the die pad can be suppressed; and the occurrence of the bonding defects can be suppressed. By using the die pad according to the embodiment in the bonding, the occurrence of the bonding defects can be suppressed. According to the semiconductor device including the semiconductor chip and the die pad according to the embodiment, the reliability and the yield of the manufacturing can be increased; and the manufacturing cost can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor chip; and
a die pad having a first surface, the semiconductor chip being bonded on the first surface using a paste including a metal particle, a concave structure being provided in the first surface, the concave structure being positioned directly under each of a plurality of sides of the semiconductor chip and extending along each of the plurality of sides;
wherein
the concave structure includes a first recess extending along a first direction parallel to the first surface,
the first recess is positioned directly under a first side of the semiconductor chip parallel to the first direction, and
a dimension of the first recess in a second direction changes along the first direction, the second direction being parallel to the first surface and perpendicular to the first direction,
wherein
the first recess includes:
a first region;
a second region separated from the first region in the first direction; and
a third region provided between the first region and the second region and positioned directly under a center of the first side in the first direction, and
a dimension of the third region in the second direction is longer than a dimension of the first region in the second direction and longer than a dimension of the second region in the second direction.

2. A semiconductor device, comprising:
a semiconductor chip; and
a die pad having a first surface, the semiconductor chip being bonded on the first surface using a paste including a metal particle, a concave structure being provided in the first surface, the concave structure being positioned directly under each of a plurality of sides of the semiconductor chip and extending along each of the plurality of sides;
wherein
the concave structure includes a first recess extending along a first direction parallel to the first surface,
the first recess is positioned directly under a first side of the semiconductor chip parallel to the first direction, and
a dimension of the first recess in a second direction changes along the first direction, the second direction being parallel to the first surface and perpendicular to the first direction,
wherein
the concave structure includes a second recess extending along the second direction,
the second recess is positioned directly under a second side of the semiconductor chip, the second side being parallel to the second direction, and
a dimension of the second recess in the first direction changes along the second direction.

3. A semiconductor device, comprising:
a semiconductor chip; and
a die pad having a first surface, the semiconductor chip being bonded on the first surface using a paste including a metal particle, a concave structure being provided in the first surface, the concave structure being positioned directly under each of a plurality of sides of the semiconductor chip and extending along each of the plurality of sides;
wherein
the concave structure includes:
a first recess extending along a first direction parallel to the first surface; and
a corner portion connected to the first recess,
the first recess is positioned directly under a first side of the semiconductor chip parallel to the first direction,
the corner portion is positioned directly under a corner of the semiconductor chip, and
a dimension of at least a portion of the corner portion in a second direction is longer than a dimension of the first recess in the second direction, the second direction being parallel to the first surface and perpendicular to the first direction.

4. The device according to claim 3, wherein
the concave structure includes a second recess extending along the second direction,
the second recess is positioned directly under a second side of the semiconductor chip, the second side being parallel to the second direction, and
the first recess and the second recess connect at the corner portion.

5. The device according to claim 3, wherein
the concave structure includes a protruding portion protruding from the corner portion toward an outer perimeter of the die pad.

6. The device according to claim 3, wherein
the concave structure includes a first recess extending along a first direction parallel to the first surface,
the first recess is positioned directly under a first side of the semiconductor chip, the first side being parallel to the first direction, and
a bottom surface of the first recess is tilted downward toward a second direction parallel to the first surface and perpendicular to the first direction.

7. The device according to claim 3, wherein
the concave structure includes a first recess extending along a first direction parallel to the first surface, the first recess is positioned directly under a first side of the semiconductor chip, the first side being parallel to the first direction, and a bottom surface of the first recess includes a tilted surface, the tilted surface is positioned between a center of the bottom surface in the first direction and an end of the bottom surface in the first direction, and the tilted surface is tilted downward from the center toward the end.

8. A semiconductor device, comprising:

a semiconductor chip; and a die pad having a first surface, the semiconductor chip being bonded on the first surface using a paste including a metal particle, a concave structure being provided in the first surface, the concave structure being positioned directly under each of a plurality of sides of the semiconductor chip and extending along each of the plurality of sides;

wherein the first surface includes a bonding region where the semiconductor chip is placed and bonded, the bonding region is positioned inside a region surrounded with the concave structure, and an outer perimeter of the bonding region is tilted toward the concave structure and toward a second surface of the die pad opposing the first surface.

* * * * *